(12) United States Patent
Ramachandran et al.

(10) Patent No.: US 8,779,559 B2
(45) Date of Patent: Jul. 15, 2014

(54) STRUCTURE AND METHOD FOR STRAIN-RELIEVED TSV

(75) Inventors: Vidhya Ramachandran, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 82 days.

(21) Appl. No.: 13/405,600

(22) Filed: Feb. 27, 2012

(65) Prior Publication Data

US 2013/0221494 A1   Aug. 29, 2013

(51) Int. Cl.
*H01L 23/522* (2006.01)

(52) U.S. Cl.
USPC .......................................... 257/621; 257/531

(58) Field of Classification Search
USPC .................................................. 257/621, 531
See application file for complete search history.

(56) References Cited

U.S. PATENT DOCUMENTS

| | | |
|---|---|---|
| 2009/0047781 A1 | 2/2009 | Pratt et al. |
| 2009/0243047 A1* | 10/2009 | Wolter et al. ................. 257/621 |
| 2009/0321796 A1 | 12/2009 | Inohara |
| 2013/0161796 A1* | 6/2013 | Huang et al. ................. 257/621 |

FOREIGN PATENT DOCUMENTS

| | | |
|---|---|---|
| DE | 10205026 C1 | 5/2003 |
| WO | 2012013162 A1 | 2/2012 |

OTHER PUBLICATIONS

International Search Report and Written Opinion—PCT/US2013/027729—ISA/EPO—Jun. 27, 2013.

* cited by examiner

*Primary Examiner* — Howard Weiss
*Assistant Examiner* — Tifney Skyles
(74) *Attorney, Agent, or Firm* — Sam Talpalatsky; Nicholas J. Pauley; Joseph Agusta

(57) ABSTRACT

A semiconductor die including strain relief for through substrate vias (TSVs). The semiconductor die includes a semiconductor substrate having an active face. The semiconductor substrate includes conductive layers connected to the active face. The semiconductor die also includes a through substrate via extending only through the substrate. The through substrate via may include a substantially constant diameter through a length of the through substrate via. The through substrate via may be filled with a conductive filler material. The semiconductor die also includes an isolation layer surrounding the through substrate via. The isolation layer may include two portions: a recessed portion near the active face of the substrate capable of relieving stress from the conductive filler material, and a dielectric portion. A composition of the recessed portion may differ from the dielectric portion.

9 Claims, 19 Drawing Sheets

STRUCTURE AND METHOD FOR STRAIN-RELIEVED TSV

TECHNICAL FIELD

The present disclosure generally relates to integrated circuits (ICs). More specifically, the present disclosure relates to strain relief for through substrate vias (ISVs).

BACKGROUND

When a TSV (through substrate via) is filled with a material that has a coefficient of thermal expansion (CTE) mismatch relative to its substrate (e.g., silicon), the TSV incurs high compressive stress. In particular, the compressive stress may be transmitted through the surrounding substrate to neighboring devices. The transferred. compressive stress may cause a shift in the parameters of the devices that surround the TSV.

Conventional techniques for addressing compressive stress include a "Keep-Out Region" surrounding the TSV. The Keep-Out Region defines an area surrounding the TSV in which sensitive devices cannot be placed. Unfortunately, a Keep-Out Region results in a circuit layout area penalty. For example, a Keep-Out Region can be as large as five to ten micro-meters (5-1.0 um) in radius, depending on the particular device sensitivity.

Copper is an example of a material that has a CTE mismatch to silicon. When a TSV confined by silicon is thermal cycled, the copper filling material within the TSVs may expand upwardly and out of the TSV. The pumping of the copper upwardly and out of the ISV may disrupt any circuits near the TSV. Although described with reference to copper, the expansion of any filling material that has a CTE mismatch with respect to its substrate, when used to fill a TSV, causes the above-noted problems.

SUMMARY

According to one aspect of the present disclosure, a semiconductor die including strain relief for through substrate vias (TSVs) is described. The semiconductor die includes a semiconductor substrate having an active face. The semiconductor substrate includes conductive layers connected to the active face. The semiconductor die also includes a through substrate via extending only through the substrate. In one configuration, the through substrate via includes a substantially constant diameter through a length of the through substrate via. The through substrate via may be filled with a conductive filler material. The semiconductor die also includes an isolation layer surrounding the through substrate via. In this configuration, the isolation layer includes two portions: a recessed portion near the active face of the substrate capable of relieving stress from the conductive filler material, and a dielectric portion. A composition of the recessed portion may differ from the dielectric portion.

In a further aspect of the disclosure, a method. for strain relief of through substrate vias (TSVs) is described. The method includes defining a through substrate via cavity in a substrate, The method also includes depositing an isolation layer in the cavity. The method further includes filling the cavity with a conductive material. The method. also includes removing a portion of the isolation layer to create a recessed portion.

In another aspect of the disclosure, a semiconductor die including means for providing strain relief of through substrate vias (TSVs) is described. The semiconductor die includes a semiconductor substrate. The semiconductor die also includes a through substrate via extending only through the substrate. In one configuration, the through substrate via includes a substantially constant diameter through a length of the through substrate via. The through substrate via may be filled with a conductive filler material. The semiconductor die also includes means for relieving stress from the conductive filler material In a further aspect of the disclosure, a method for a method for strain relief of through substrate vias (TSVs) is described. The method includes the step of defining a through substrate via cavity in a substrate. The method also includes the step of depositing an isolation layer in the cavity. The method further includes the step of filling the cavity with a conductive material. The method also includes the step of removing a portion of the isolation layer to create a recessed portion.

Additional features and advantages of the disclosure will be described below. It should. be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Various aspects of the disclosure provide techniques to mitigate problems relating to the impact of TSV (through substrate via) stress on neighboring devices. According to one aspect of the disclosure, a liner isolation film is described that separates a conductive portion of a through substrate via (TSV) from a substrate (e.g., silicon) layer. In one configuration, a liner isolation layer is recessed around the TSV to a depth in the range of a few microns. In another configuration, the isolation recess void is back-filed with a compliant material. Example compliant materials include, but are not limited to, polyimide and. other like compliant materials. in a another aspect of the disclosure, following the TSV formation process, back-end of line (BEOL) interconnect layers are fabricated on the wafer to complete an IC device.

Advantageously, the recess opened up between the TSV and the substrate layer allows for strain relief of the TSV and. reduces the strain transmitted to the neighboring devices within the substrate. Likewise, by allowing a pathway for the TSV fill material to expand into a recess cavity, filler material pump-out can be reduced. Varying a composition of the liner isolation layer provides different advantages. Back-filling the recess with a compliant material may provide similar advantages with a more robust integration scheme.

Figure 1:
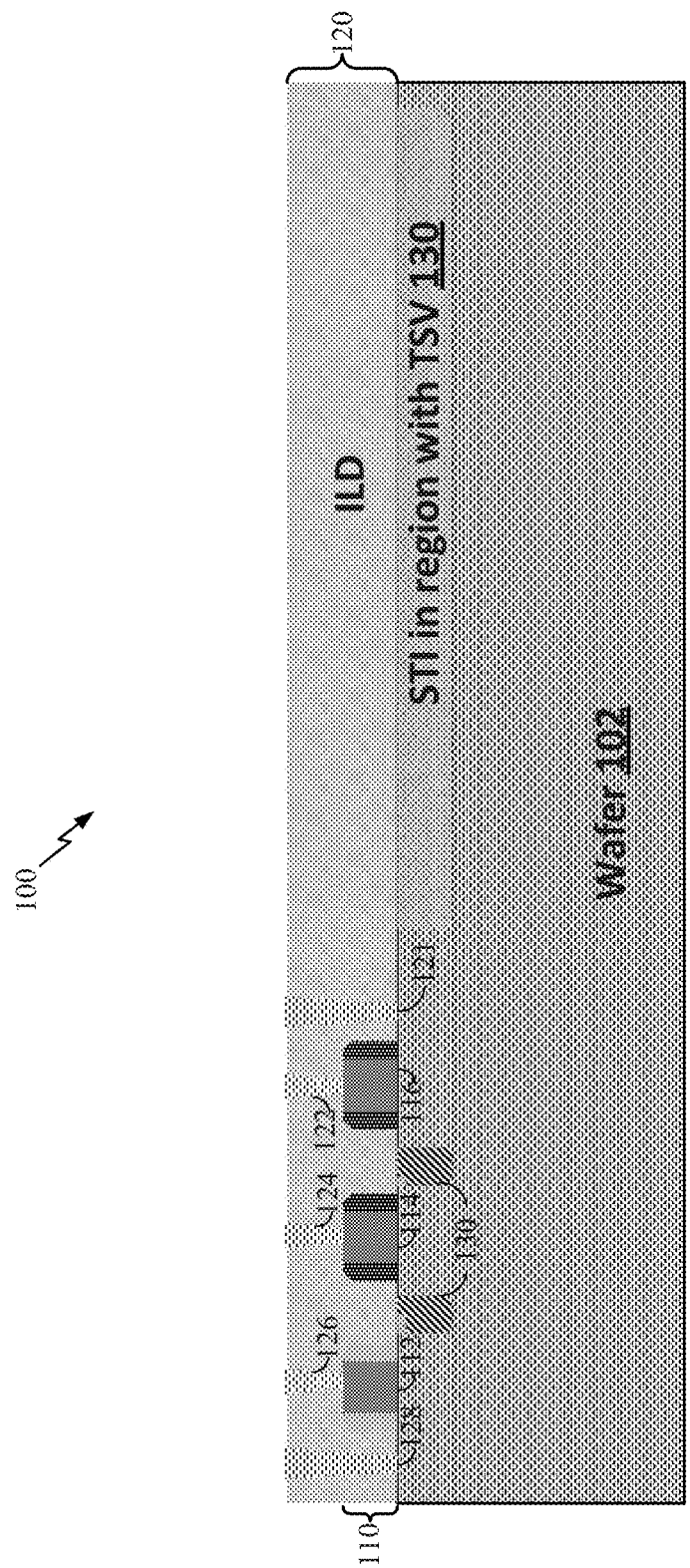
FIG. 1 shows a cross-sectional view illustrating an integrated circuit (IC) device including active devices according to one aspect of the disclosure.

FIG. 1 shows a cross-sectional view illustrating an integrated circuit (IC) device 100 including active devices 112-116 according to one aspect of the disclosure. Representatively, the IC device 100 includes a substrate e.g., a silicon wafer) 102 including a shallow trench isolation (STI) region 130. In this configuration, the STI region 130 is a semi-metallic or other like material. Above the STI region 130 is an inter-layer dielectric (ILD) layer 120 including a front-end of line (FEOL) interconnect layer 110, The ILD 120 may include active devices 112-116 and conducive wires (e.g., vias) 121-128. In this configuration, the ILD layer 120 is a contact ILD formed of a silicon oxide or other like material for preventing shorting between the conductive wires 121-128, In an alternative configuration, the ILD layer 120 is a low-K dielectric or other like material.

Figure 2:
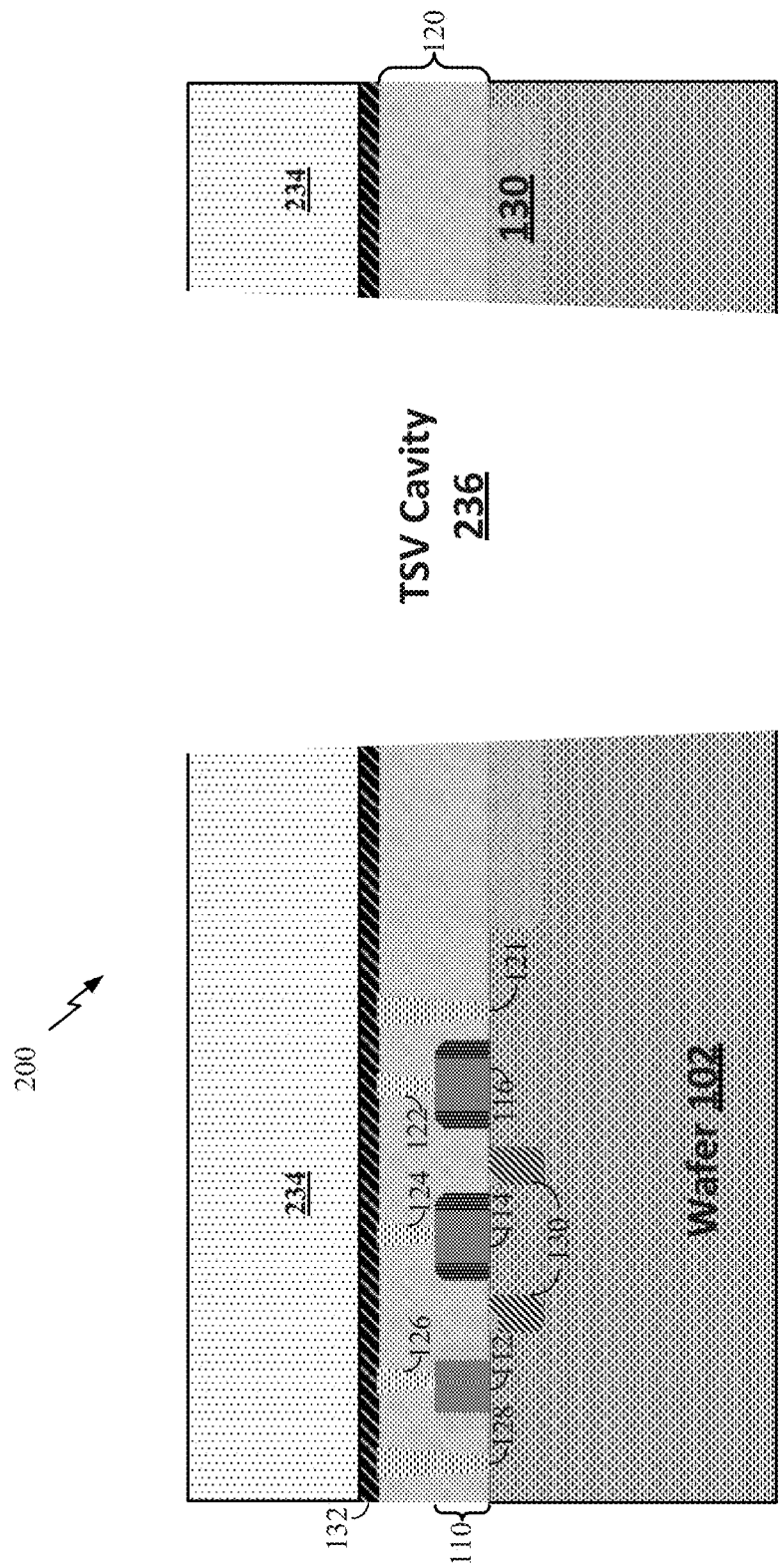
FIG. 2 shows a cross-sectional view illustrating the IC device of FIG. 1, including a photo resist layer to provide an increased size opening for a through substrate via (TSV) according to one aspect of the disclosure.

FIG. 2 shows a cross-sectional view illustrating the IC device 200 of FIG. 1, including a photo resist layer 234 to provided an increased size TSV cavity 236 (e.g., fifty microns) for one or more isolation layers and a TSV (through-substrate via) according to one aspect of the disclosure. As shown in FIG. 2, after depositing the polish stop layer 132 on a surface of the ILD layer 120, lithography defines a TSV (through-substrate via) cavity 236 that is slightly larger than an actual, final TSV (see FIGS. 4-8). In this configuration, a size of the TSV is on the order of 0.25-0.5 micro-meters (μm). The polish stop layer 132 may be formed of a silicon carbide, silicon nitride, or other like protective material.

Figure 3:
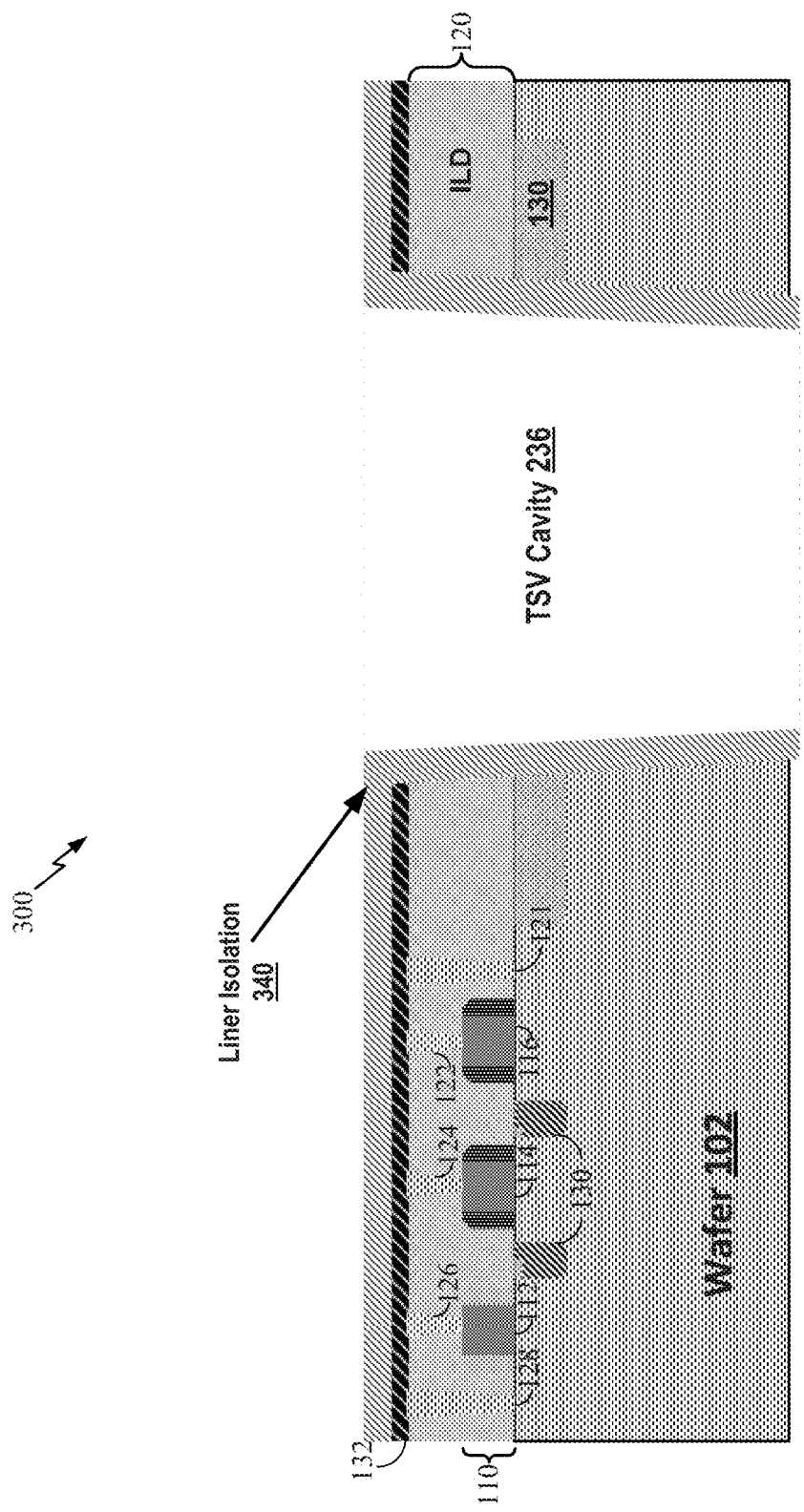
FIG. 3 shows a cross-sectional view illustrating the IC device of FIG. 2, including a liner isolation layer according to one aspect of the disclosure.

FIG. 3 shows a cross-sectional view illustrating the IC device 300 of FIG. 2, with a liner isolation layer 340 according to one aspect of the disclosure. In this configuration, an etch and/or lithographic process etches through the ILD layer 120, the STI region 130, and the silicon wafer 102. After the etch is complete, a liner isolation deposition forms the liner isolation layer 340 onto the polish stop layer 132 and the sidewalls of the TSV cavity 236. The liner isolation layer 340 may be formed with a layer of unfluorinated silica glass (USG), tetraethyl orthosilicate (TEOS), oxide, silicon nitride, or other like precursor for forming an oxide film, The liner isolation layer 340 may also be formed with a layer of organic material such as an organic insulator. The liner isolation layer 340 may have a thickness of one-quarter micron.

Figure 4:
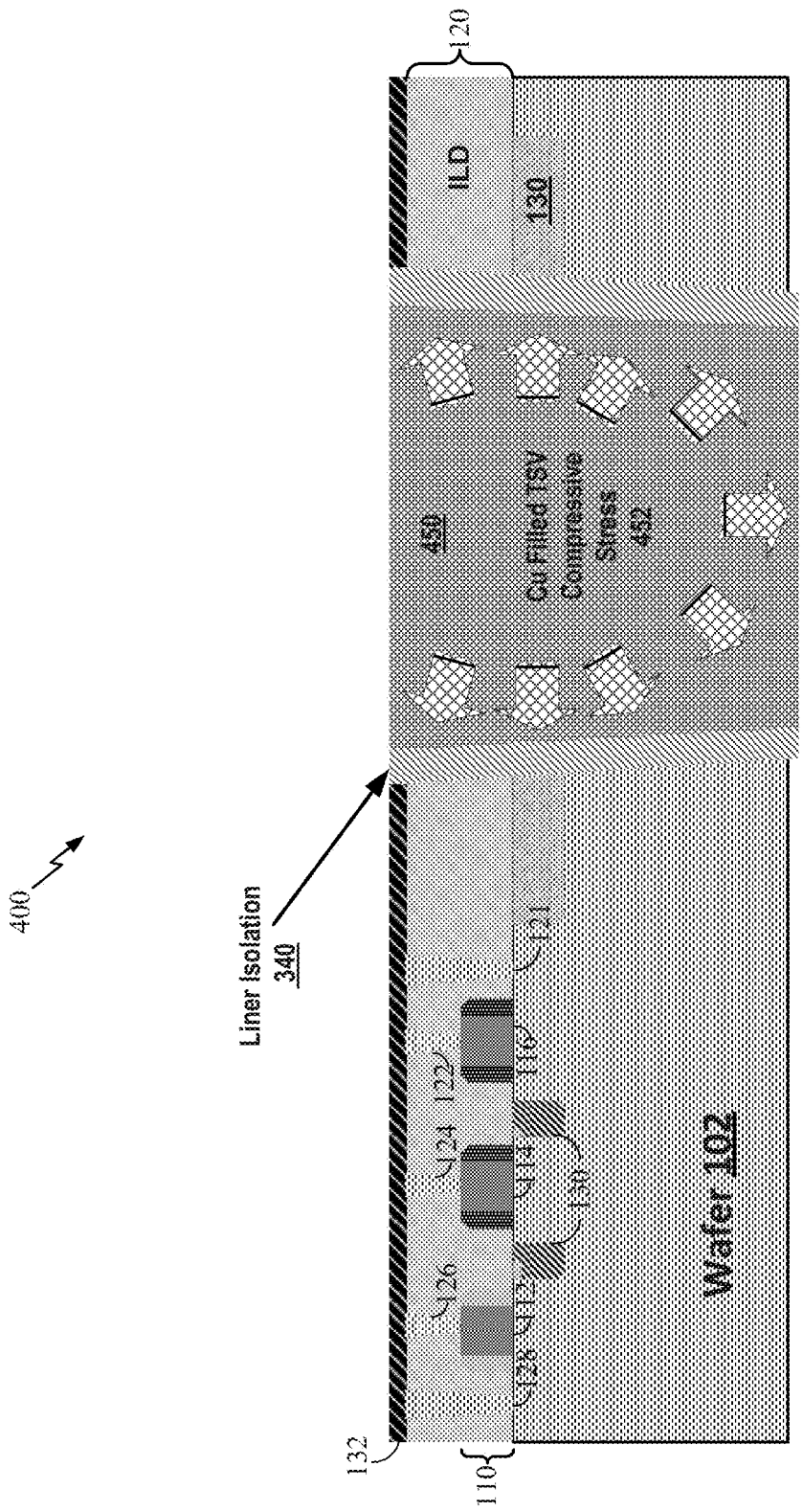
FIG. 4 shows a cross-sectional view of the IC device of FIG. 3, illustrating a through substrate via (TSV) surrounded by the liner isolation layer according to one aspect of the disclosure.

FIG. 4 shows a cross-sectional view illustrating the IC device 400 of FIG. 3, including a through substrate via (TSV) 450 surrounded by the liner isolation layer 340 according to one aspect of the disclosure. As shown in FIG. 4, a TSV fill and polish process is performed to fill the TSV cavity with a filler material for forming the TSV 450, which is surrounded by the liner isolation layer 340. in the illustrated example, the filler material is copper, The liner isolation layer 340 prevents the filler material within the TSV 450 from contacting the silicon wafer 102, The filler material may include, but is not limited to, copper, tungsten, or other like filler material having a coefficient of thermal expansion (CTE) mismatch relative to the substrate material, which in this example is silicon. As shown in FIG. 4, compressive stress 452 may affect the active devices 112-116 within the MD layer 120, and/or the silicon wafer 102.

Figure 5:
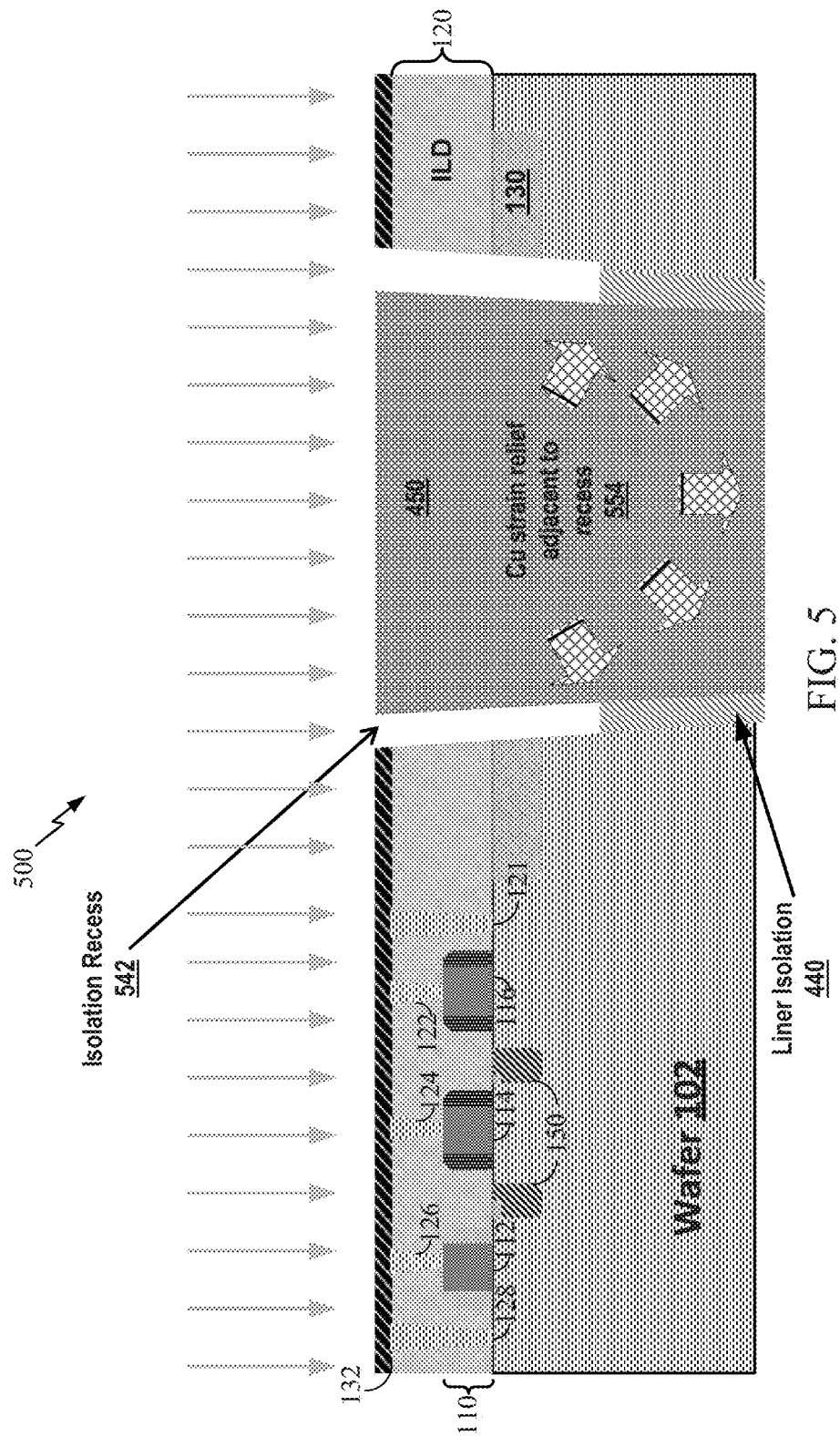
FIG. 5 shows a cross-sectional view illustrating the IC device of FIG. 4, including an isolation recess formed within the liner isolation layer according to one aspect of the disclosure.

FIG. 5 shows a cross-sectional view illustrating the IC device 500 of FIG. 4, including an isolation recess 542 formed within the liner isolation layer 440 according to one aspect of the disclosure, As shown in FIG. 5, a chemically selective etch of the liner isolation layer 440 is performed. Representatively, the chemically selective etch removes the polish stop layer 132 that is over the liner isolation layer 440 and forms the isolation recess 542 to a depth of one to two microns, In one aspect of the disclosure, the depth of the isolation recess is based on how deep the devices (e.g., the active devices 112 116) extend into the silicon wafer 102, which may be determined according to the transistor technology. As shown in FIG. 5, the chemically selective etch process causes the formation of the isolation recess 542 for providing stress relief for the filler material of the TSV 450.

Figure 6:
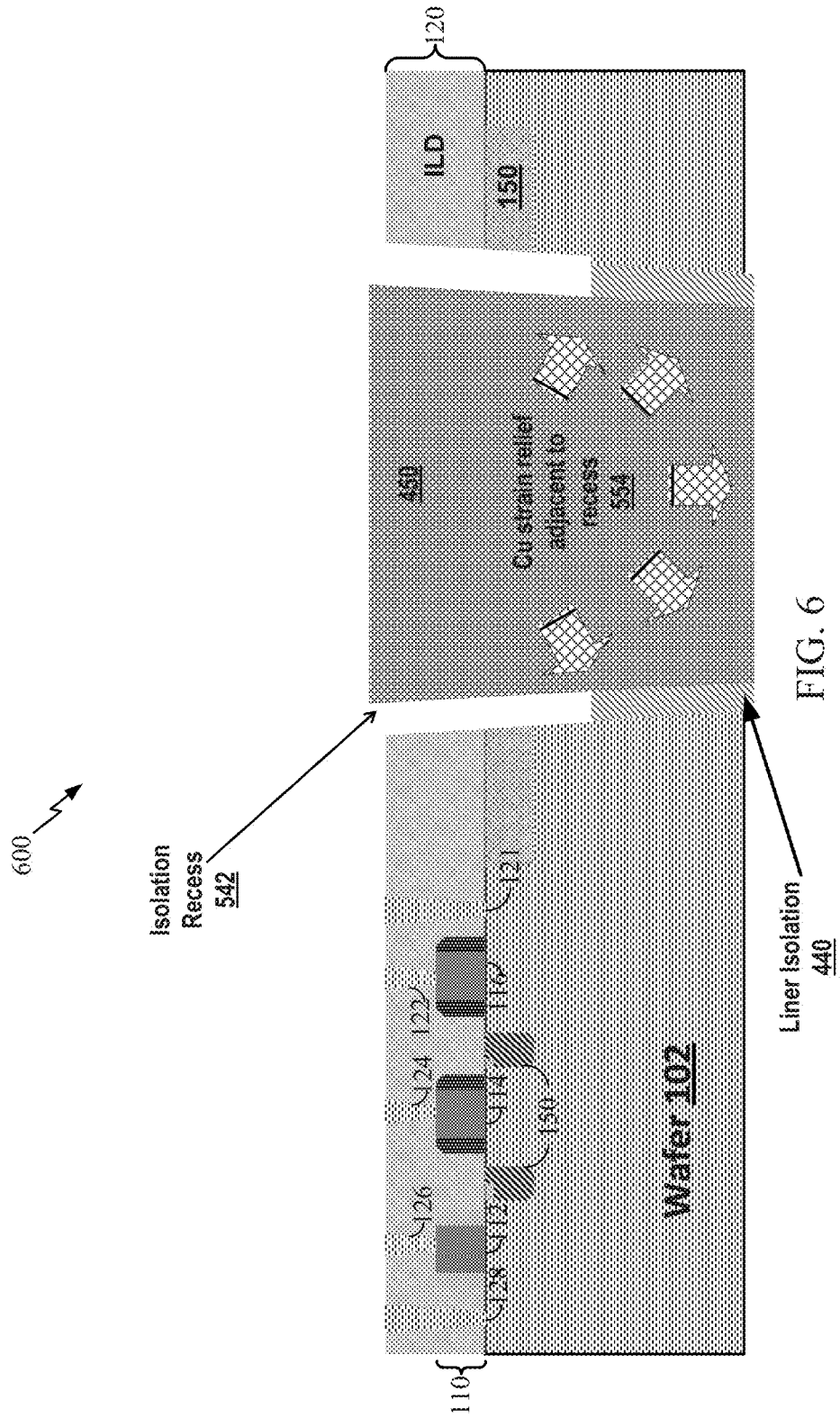
FIG. 6 shows a cross-sectional view illustrating the IC device of FIG. 5, including an isolation recess and the liner isolation layer formed on a sidewall of a TSV cavity according to one aspect of the disclosure.
Figure 7:
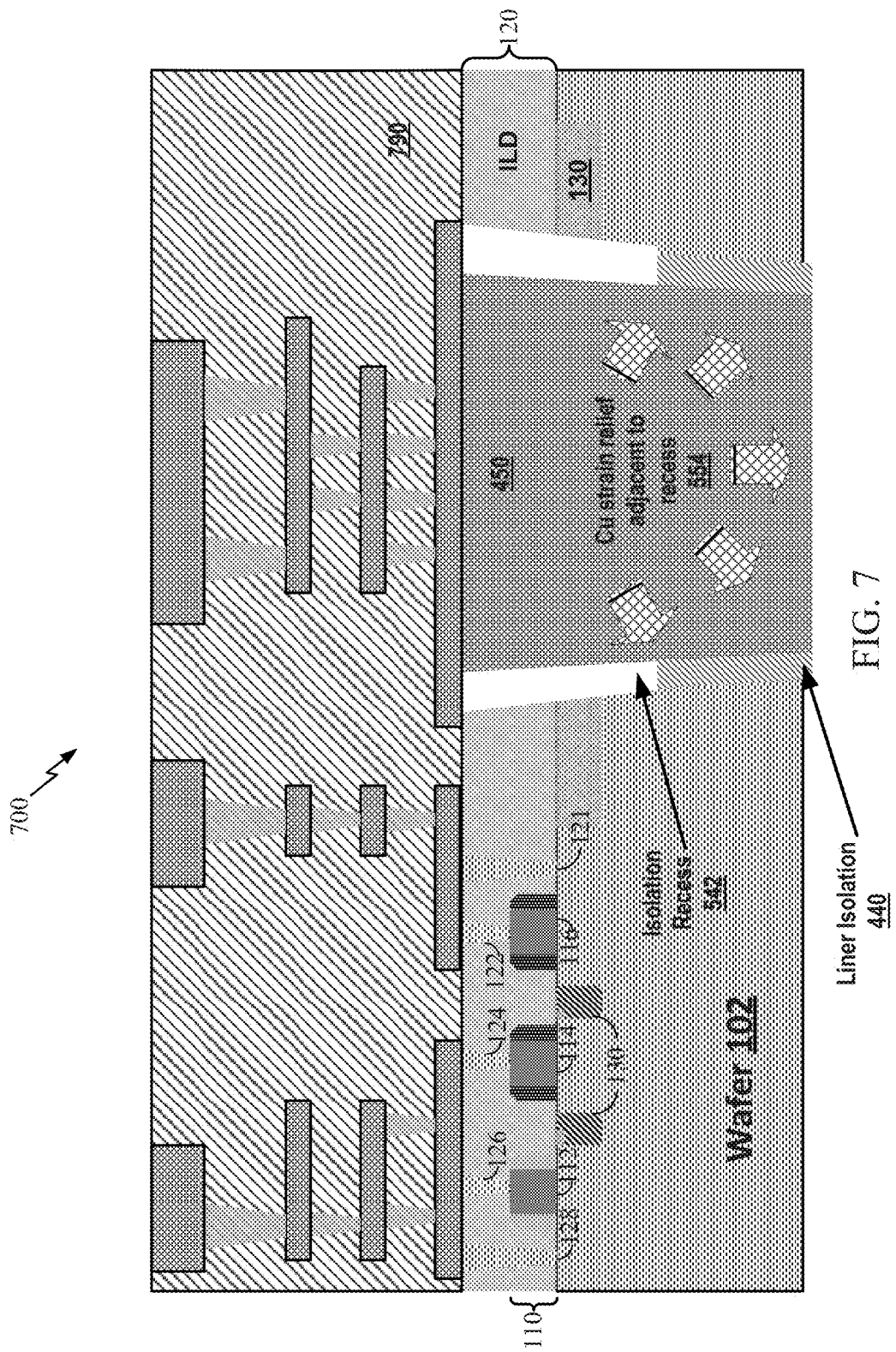
FIG. 7 shows a cross-sectional view illustrating the IC device of FIG. 6, following a back-end of line (BEOL) stack fabrication according to one aspect of the disclosure.

FIG. 6 shows a cross-sectional view illustrating the IC device 600 of FIG. 5, including an isolation recess 542 and the liner isolation layer 440 formed on a sidewall of the TSV 450 according to one aspect of the disclosure, Representatively, a polish stop removal is performed to remove the polish stop layer 132 in preparation for the formation of a back-end of line interconnect stack, as shown in FIG. 7.

FIG. 7 shows a cross-sectional view illustrating the IC device 700 including of FIG. 6, following a back-end of line (BUM) stack fabrication according to one aspect of the disclosure, Representatively, after TSV processing is complete, BEOL interconnect layers of the BEOL interconnect stack 790 are fabricated on the wafer 102 to complete the formation of the IC device 700. In this configuration, the isolation recess 542 provides strain relief for the TSV filler material to reduce and/or prevent the filler material from being pumped upwards and out of the TSV.

Figure 8:
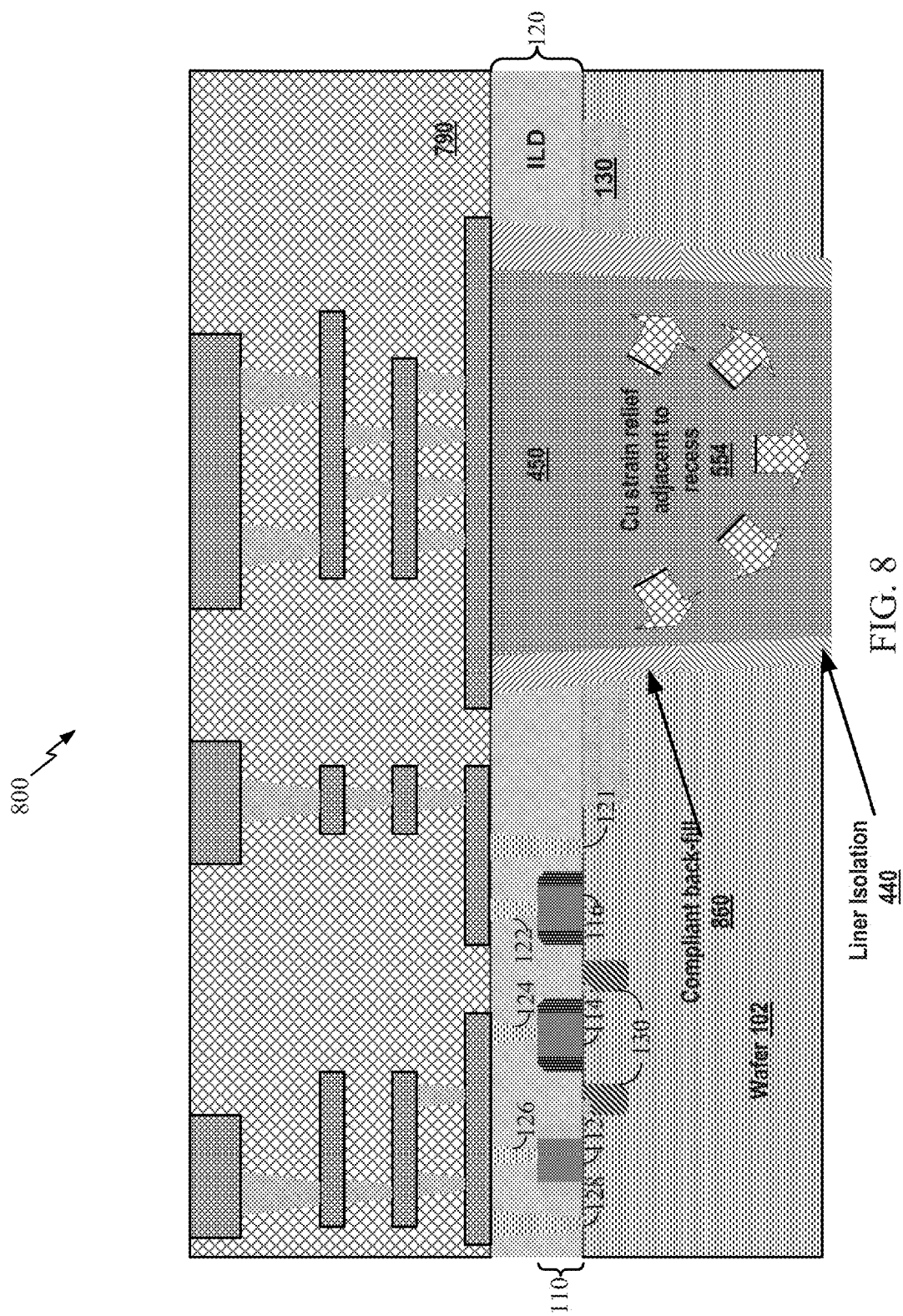
FIG. 8 shows a cross-sectional view illustrating the IC device of FIG. 7, including a through substrate via having a liner isolation layer and a back-fill material within a side-wall isolation recess according to one aspect of the disclosure.

FIG. 8 shows a cross-sectional view illustrating the IC device 800 of FIG. 7, including a TSV 450 having a liner isolation layer 440 and a compliant back-fill material 860 within a side-wall isolation recess 542 according to one aspect of the disclosure. In this aspect of the disclosure, the compliant back-fill material 860 may be a polyimide or other like material. In this configuration, the compliant back-fill material 860 absorbs compressive stress 554 from the TSV 450 and/or the surrounding devices.

Figure 9:
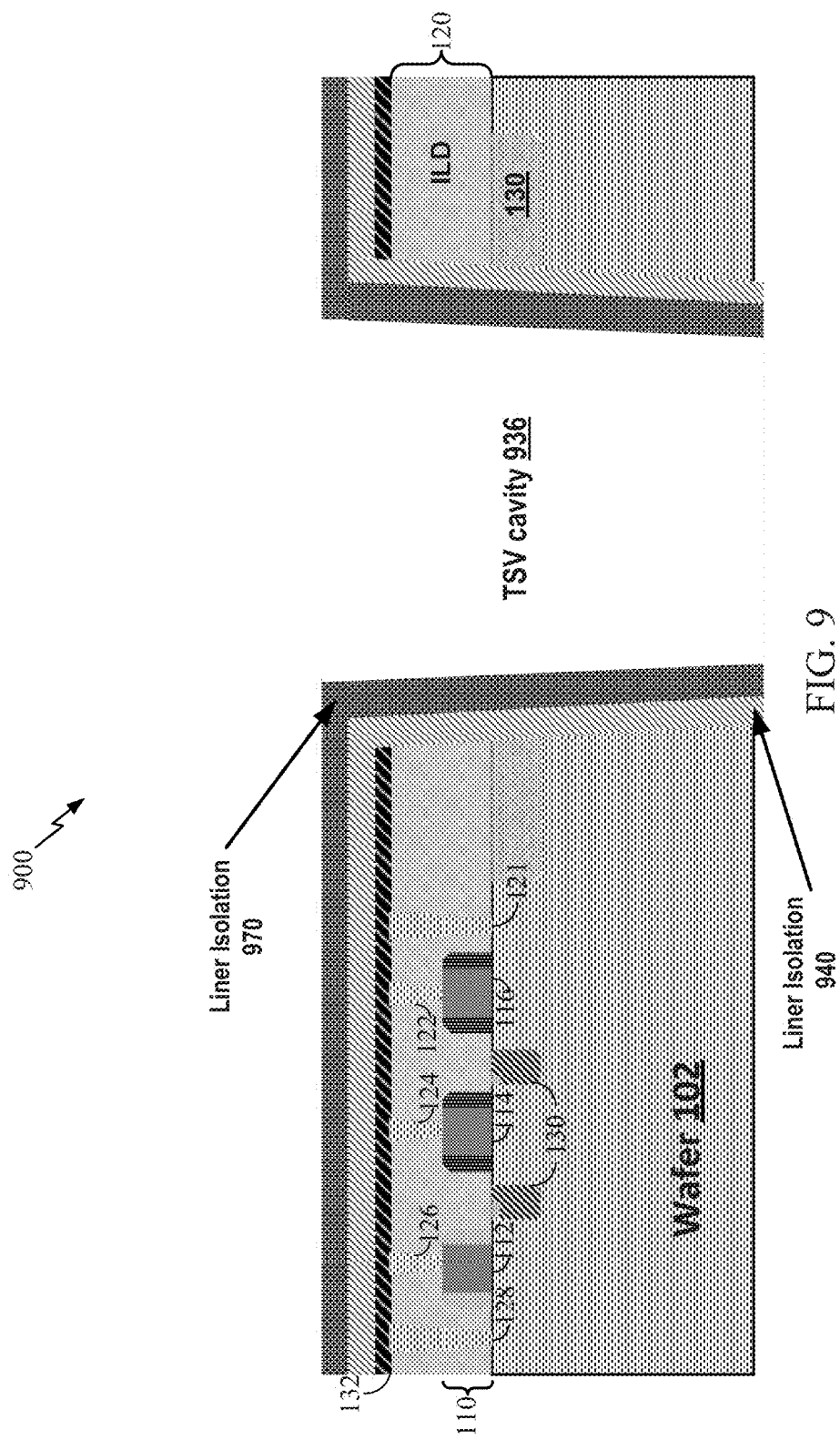
FIG. 9 shows a cross-sectional view illustrating the IC device of FIG. 1, illustrating first and second liner isolation layers according to one aspect of the disclosure.

FIG. 9 shows a cross-sectional view illustrating the IC device 900 of FIG. 1, with a first liner isolation layer 940 and a second liner isolation layer 970 according to one aspect of the disclosure, In one configuration, the first liner isolation layer 940 and the second liner isolation layer 970 are chemically distinct. Representatively, FIG. 9 illustrates a variation of the liner isolation deposition in which a multi-layer liner isolation is formed onto the polish stop layer 132 and the sidewalls of the TSV cavity 936. In this configuration, the multi-liner isolation layers may include an oxide, a nitride or other like dielectric material.

Figure 10:
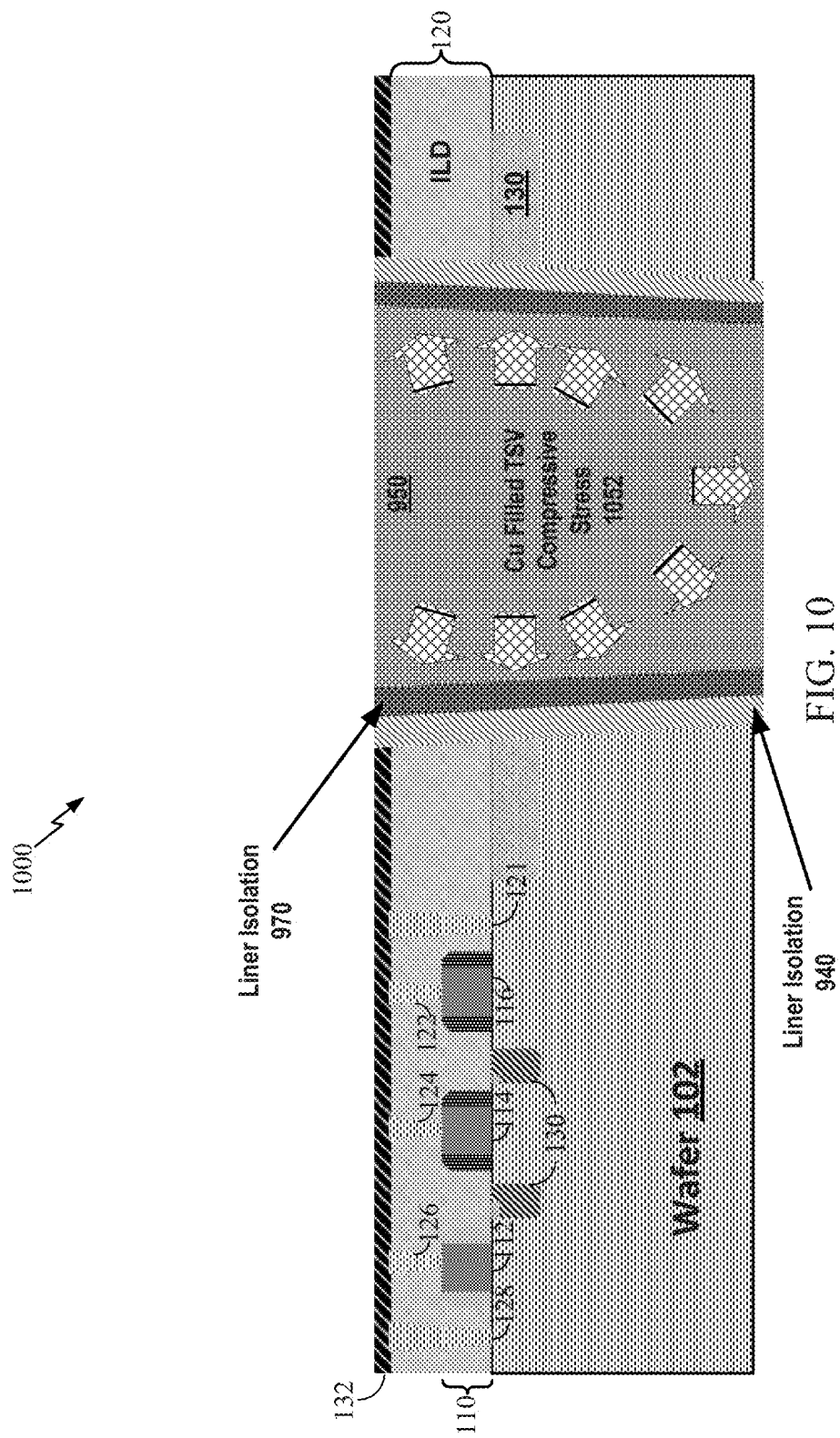
FIG. 10 shows a cross-sectional view illustrating the IC device of FIG. 9, illustrating a through substrate via (TSV) surrounded by the first and second liner isolation layers according to one aspect of the disclosure.

FIG. 10 shows a cross-sectional view illustrating the IC device 1000 of FIG. 9, with a through substrate via (TSV) 950 surrounded by the first liner isolation layer 940 and the second liner isolation layer 970 according to one aspect of the disclosure. As shown in FIG. 10, TSV fill and polish processes provide the TSV 950 including a multi-layer liner isolation (940, 970) on the TSV sidewalls. As shown in FIG. 10, the arrows 1052 illustrate compressive stress caused by the copper filled TSV 950.

Figure 11:
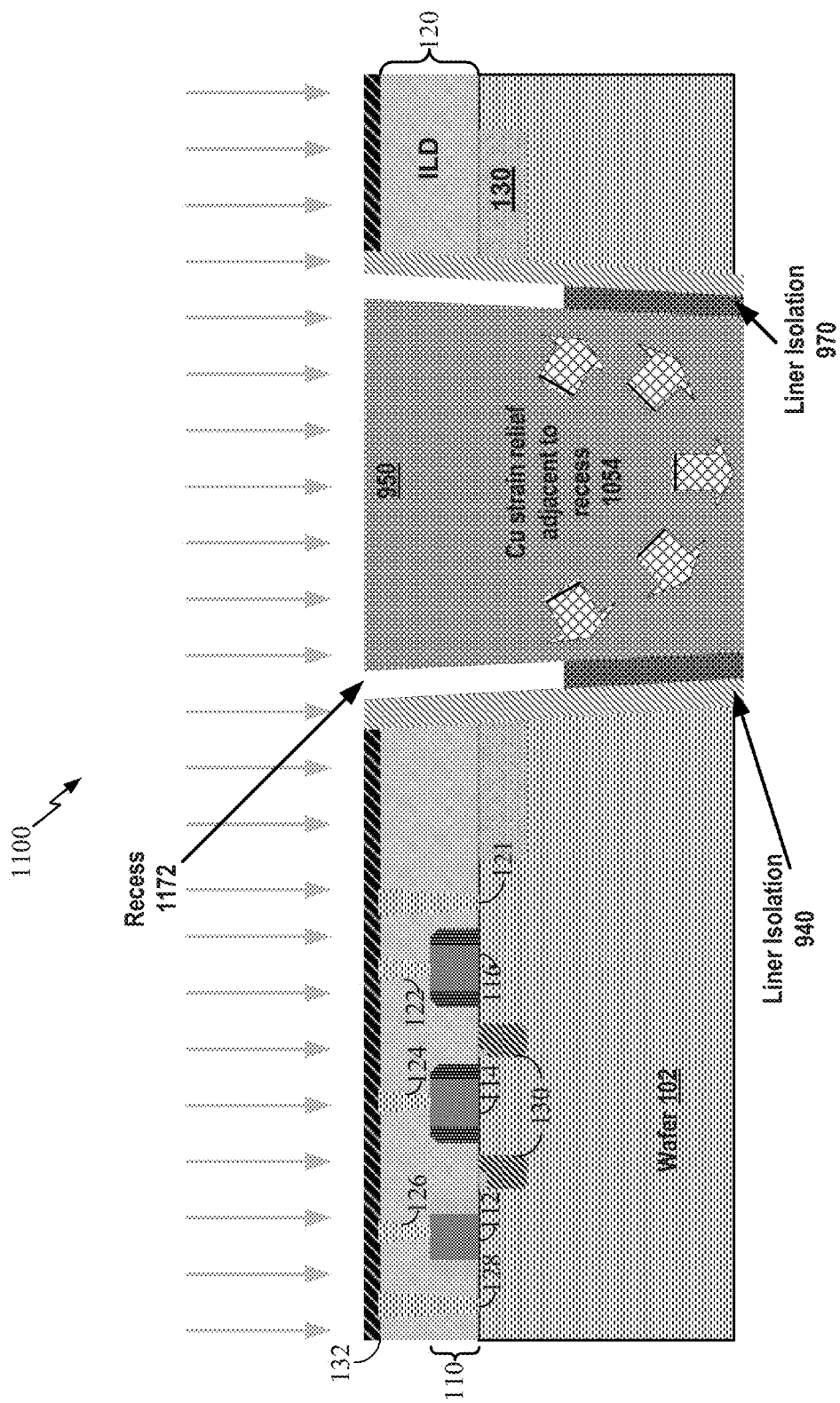
FIG. 11 shows a cross-sectional vie illustrating the IC device of FIG. 10, including an isolation recess formed within the second liner isolation layer according to one aspect of the disclosure.

FIG. 11 shows a cross-sectional view illustrating the IC device 1100 of FIG. 10, including an isolation recess 1172 formed within the second liner isolation layer 970 according to one aspect of the disclosure. Representatively, a liner isolation recess etch is performed. In this configuration, the liner isolation recess etch is a chemically selective. etch that only removes a portion of one of the two liner isolation layers 940/970. As shown in FIG. 11, the isolation recess 1172 may provide an additional isolation barrier between the TSV filler material and the silicon of the wafer 102.

Figure 12:
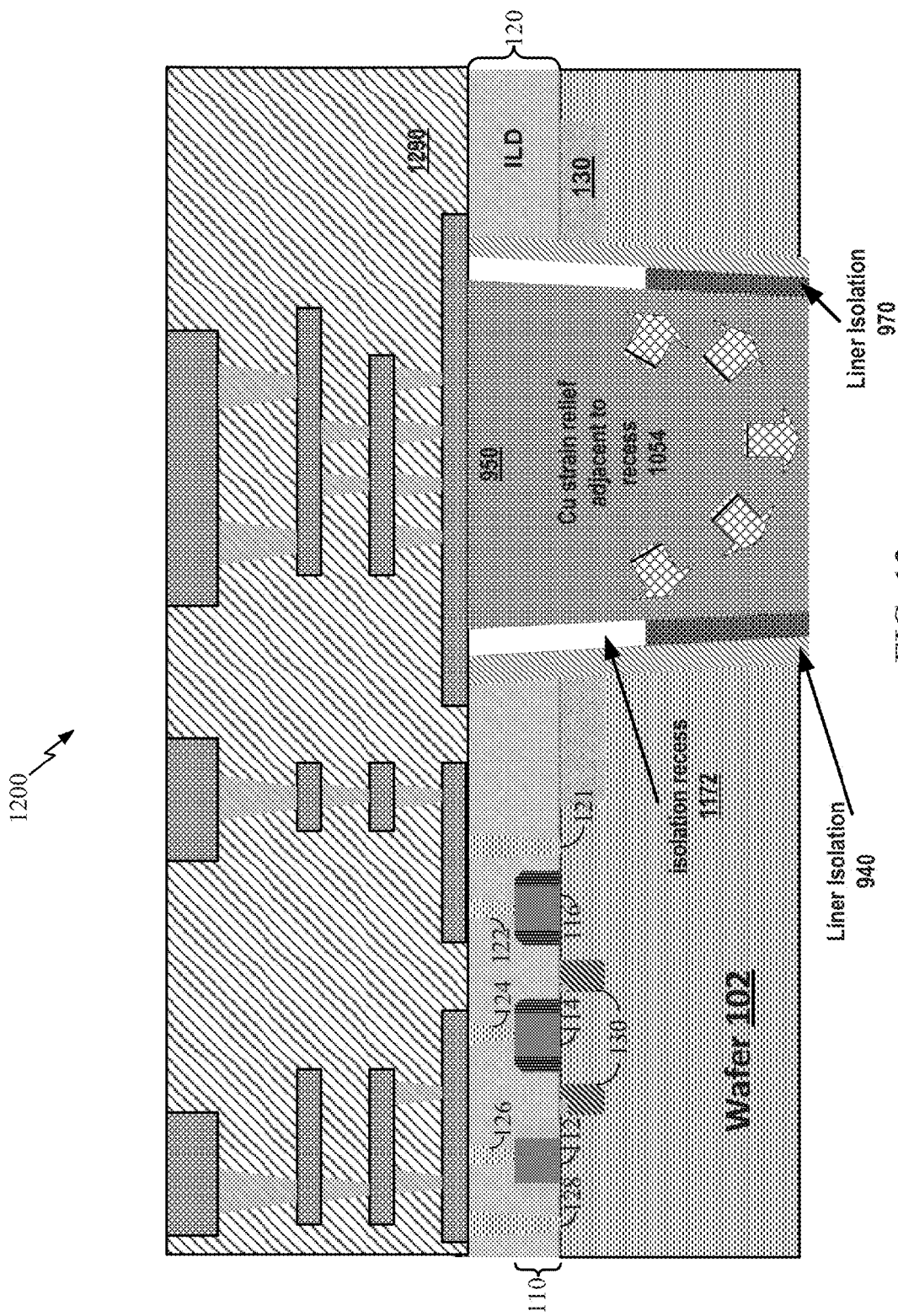
FIG. 12 shows a cross-sectional view illustrating the IC device of FIG. 11, following a back-end of line (BEOL) stack fabrication according to one aspect of the disclosure.

FIG. 12 shows a cross-sectional view illustrating the IC device 1200 of FIG. 11, following a back-end of line (BEOL) stack fabrication according to one aspect of the disclosure. Representatively, after TSV processing is complete, BEOL interconnect layers of a BEOL interconnect stack 1290 are fabricated on the silicon wafer 102 to complete the formation of the IC device 1200. In this configuration, the isolation recess 1172 provides strain relief for the TSV filler material to reduce and/or prevent the filler material from being pumped upwards and. out of the TSV 950.

Figure 13:
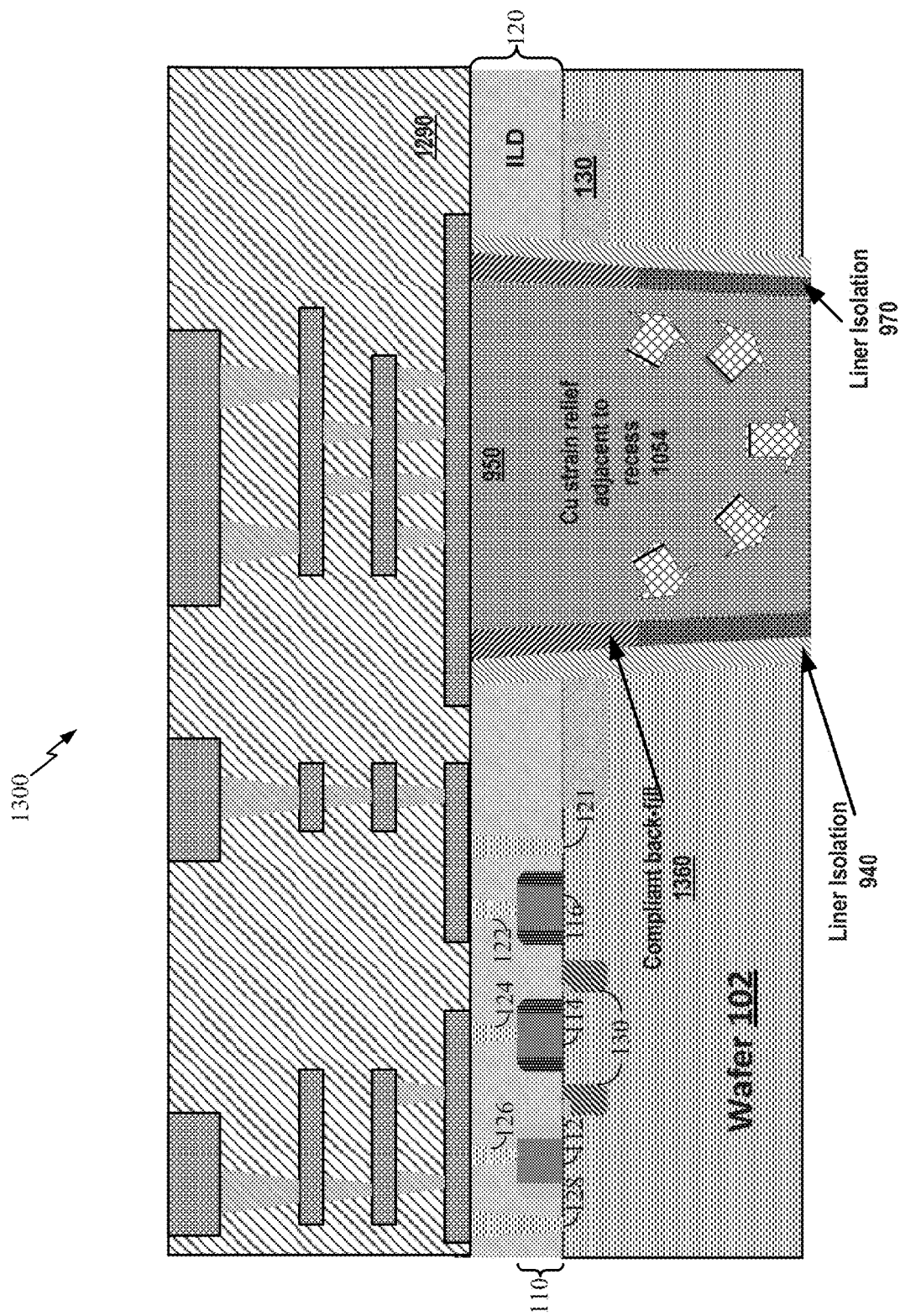
FIG. 13 shows a cross-sectional view illustrating the IC device of FIG. 12, including a back-fill material within an isolation recess of a multi-layer liner isolation according to one aspect of the disclosure.

FIG. 13 shows a cross-sectional view illustrating the IC device 1300 of FIG. 12, including a compliant back-fill material 1360 within an isolation recess of a multi-layer liner isolation (940, 970) according to one aspect of the disclosure. As shown in FIG. 13, the TSV 950 includes a first liner isolation layer 940, a second liner isolation layer 970, and a compliant back-fill material 1360 within a side-wall isolation recess 1142 according to one aspect of the disclosure. In this aspect of the disclosure, the compliant back-fill material may be a polyimide or other like material. In this configuration, the compliant back-fill material 1360 absorbs compressive stress 1054 from the TSV 950 and/or the surrounding devices.

Figure 14:
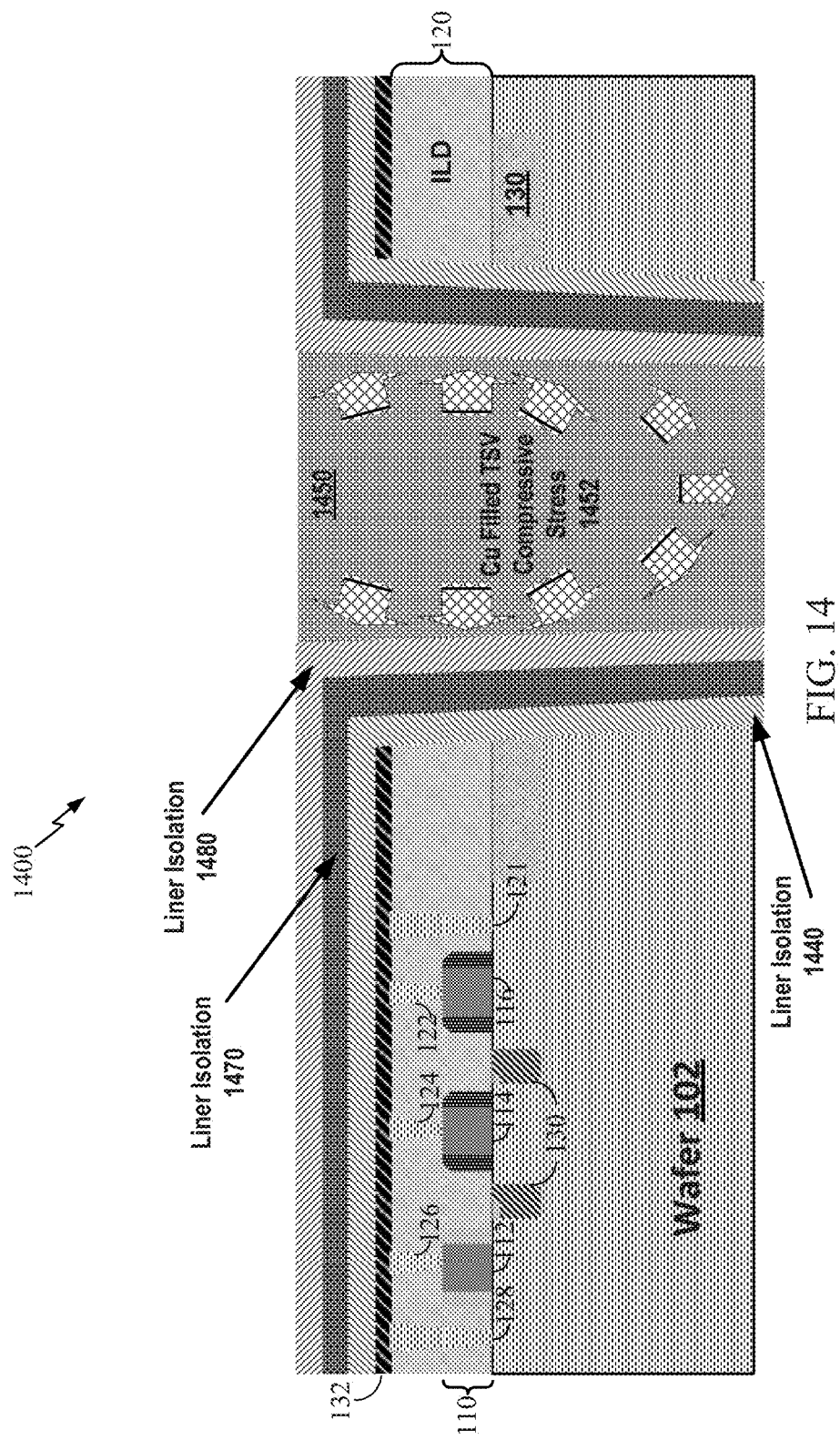
FIG. 14 shows a cross-sectional view illustrating an IC device of FIG. 9, including a through substrate via (TSV) surrounded by the first, second, and third liner isolation layers according to one aspect of the disclosure.

FIG. 14 shows a cross-sectional view illustrating the IC device 1400 of FIG. 9, including a through substrate via (TSV) 1450 surrounded by first, second, and third liner isolation layers (1440, 1470, 1480) according to one aspect of the disclosure. In one configuration, the first liner isolation layer 1440, the second. liner isolation layer 1470, and the third liner isolation layer 1480 are chemically distinct. Representatively, FIG. 14 illustrates a variation of the liner isolation deposition in which a multi-layer liner isolation is formed onto the polish stop layer 132 and the sidewalls of the TSV cavity 1450. As shown in FIG. 14, the arrows 1452 illustrate compressive stress caused by a copper filled TSV 1450. In this configuration, the multi-liner isolation layers may include an oxide, a nitride or other like dielectric material.

Figure 15:
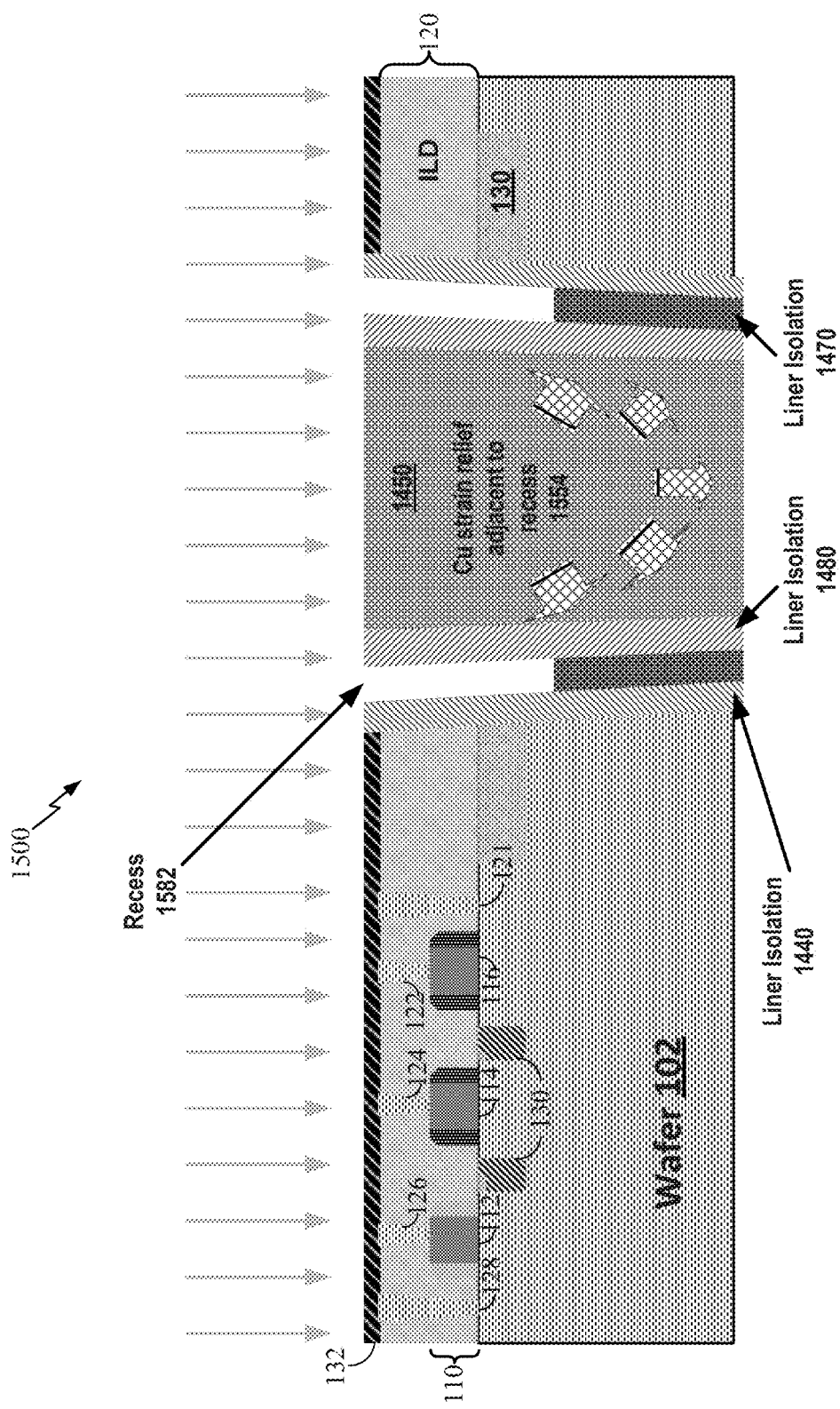
FIG. 15 shows a cross-sectional view illustrating the IC device of FIG. 14, including an isolation recess formed within the second liner isolation layer according to one aspect of the disclosure.

FIG. 15 shows a cross-sectional view illustrating the IC device 1500 of FIG. 14, including an isolation recess 1582 formed within the second liner isolation layer 1470 according to one aspect of the disclosure. Representatively, a liner isolation recess etch is performed, In this configuration, the liner isolation recess etch is a chemically selective etch that only removes a portion of one of the three liner isolation layers 1440/1470/1480. As shown in FIG. 15, the isolation recess 1582 may provide an additional isolation barrier between the TSV filler material and the material of the wafer 102.

Figure 16:
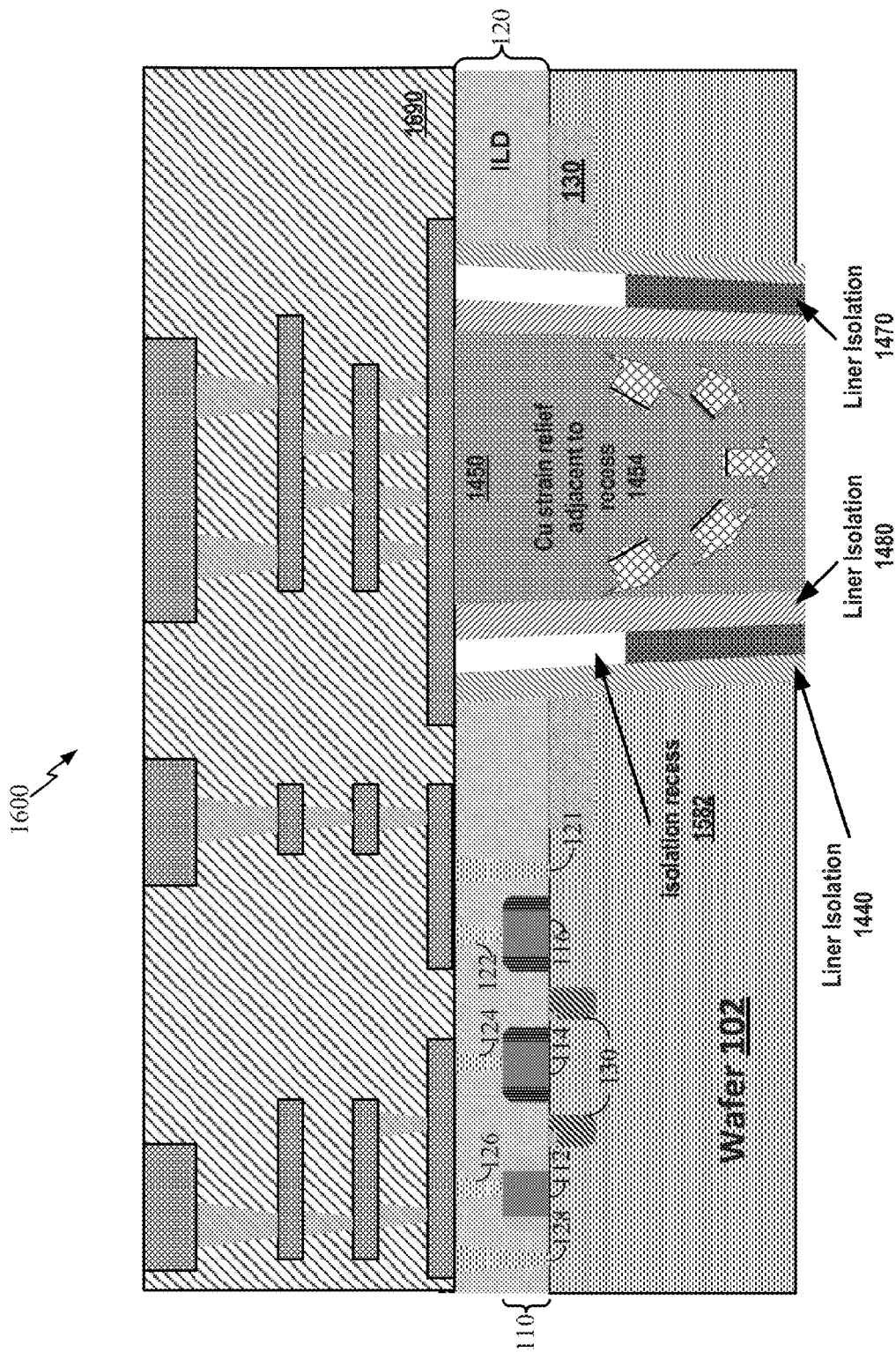
FIG. 16 shows a cross-sectional view illustrating the IC device of FIG. 15, following a back-end of line (BEOL) stack fabrication according to one aspect of the disclosure.

FIG. 16 shows a cross-sectional view illustrating the IC device 1600 of FIG. 15, following a back-end of line (BEOL) stack fabrication according to one aspect of the disclosure. Representatively, after TSV processing is complete, BEOL interconnect layers of a BEOL interconnect stack 1690 are fabricated on the wafer 102 to complete the formation of the IC device 1600. In this configuration, the isolation recess 1582 provides strain relief for the TSV filler material to reduce and/or prevent the filler material from being pumped upwards and out of the TSV 1450.

Figure 17:
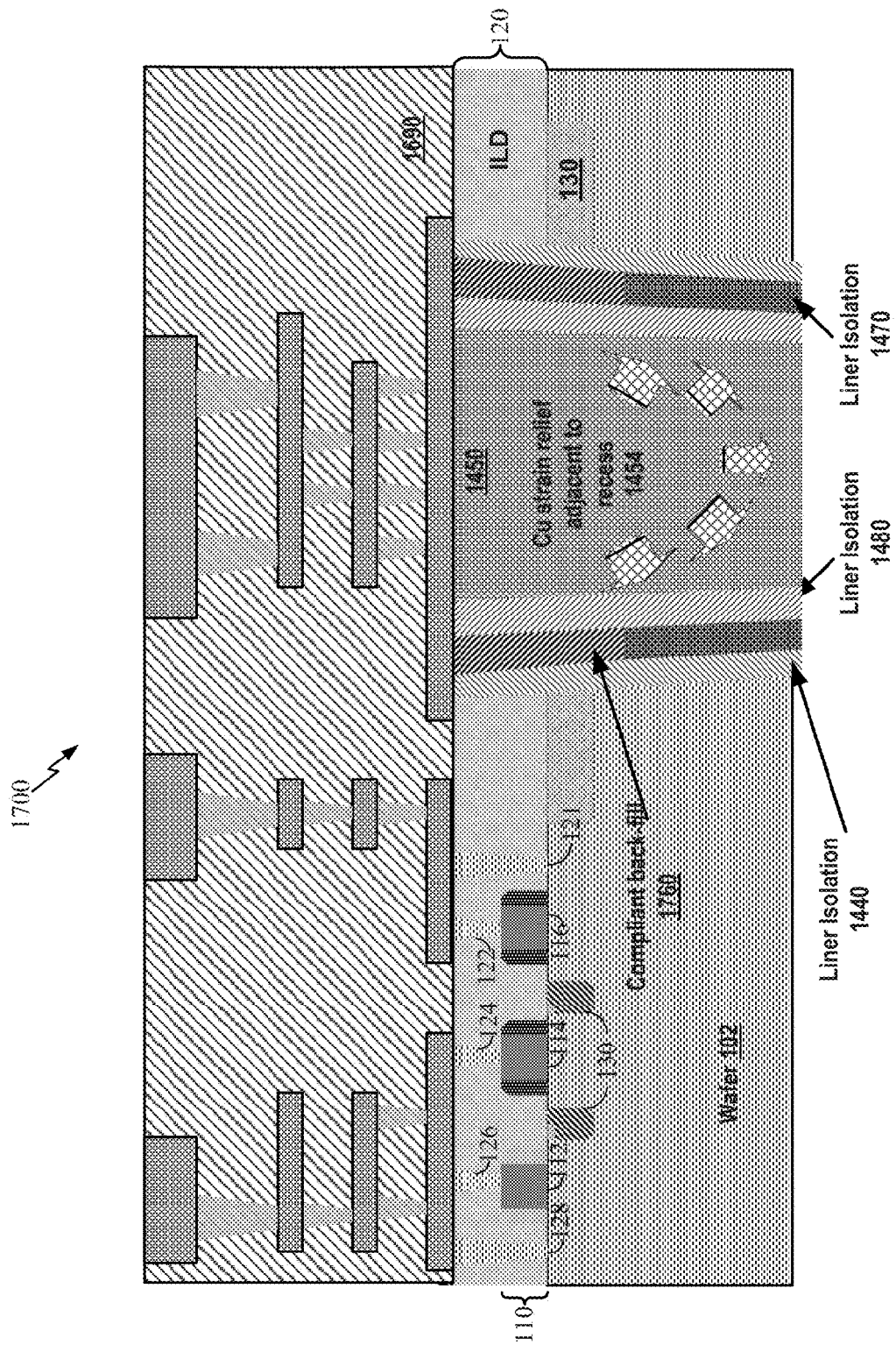
FIG. 17 shows a cross-sectional view illustrating the IC device of FIG. 16, including a back-fill material within an isolation recess of a multi-layer liner isolation according to one aspect of the disclosure.

FIG. 17 shows a cross-sectional view illustrating the IC device 1700 of FIG. 16, including a compliant back-fill material 1760 within an isolation recess of a multi-layer liner isolation (1440, 1470, 1480) according to one aspect of the disclosure. As shown in FIG. 17, a TSV 1450 includes a first liner isolation layer 1440, a second liner isolation layer 1.470, a third liner isolation layer 1480, and a compliant back-fill material 1760 within a side-wall isolation recess 1582 (FIG. 16) according to one aspect of the disclosure. In this aspect of the disclosure, the compliant back-fill material 1760 may be a polyimide or other like material. In this configuration, the compliant back-fill material 1760 absorbs compressive stress 1454 from the TSV 1450 and/or the surrounding devices.

Figure 18:
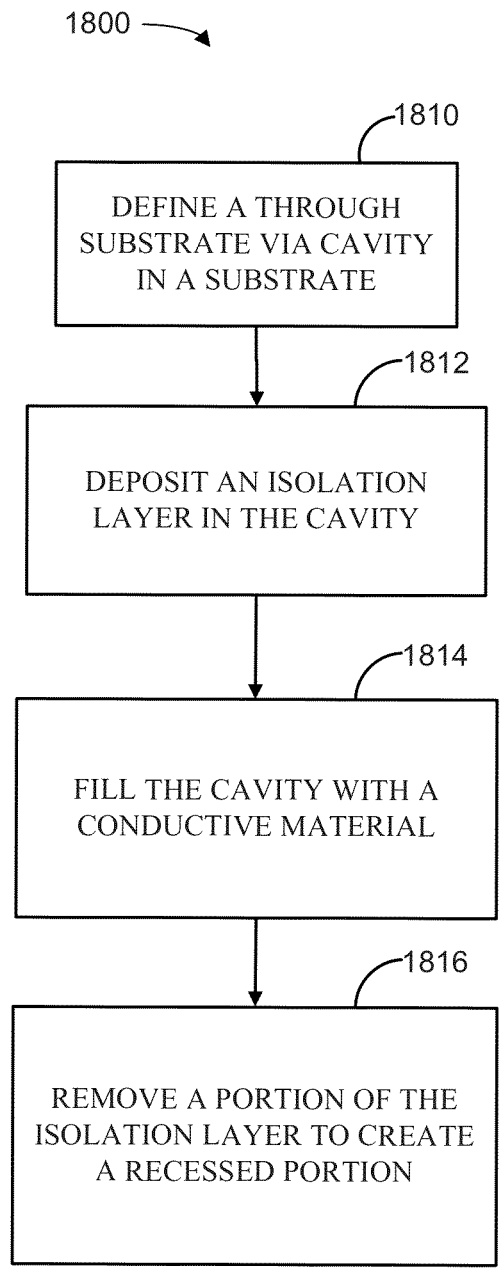
FIG. 18 is a block diagram illustrating a method for forming a through substrate vias (TSVs) including one or more liner isolation layers and an isolation recess on a sidewall of the TSV, according to one aspect of the disclosure.

FIG. 18 is a block diagram illustrating a method 1800 for forming a through substrate via (TSV) including one or more liner isolation layers and an isolation recess on a sidewall of the TSV, according to one aspect of the disclosure. At block 1810, a TSV cavity 236/936 is defined through a substrate, for example, as shown in FIGS. 2, 3, and 9, Although the present description has been primarily with respect to a silicon substrate, other substrate materials are also contemplated. At block 1812, a liner isolation layer is deposited in the TSV cavity and on a polish stop layer. for example, as shown in FIGS. 3, 9, and 14. At block 1814, the through substrate via 450/1050/1450 is filled with a conductive material, for example, as shown in FIGS. 4, 10, and 14. Although the present description has been primarily with respect to a copper filler, other filler materials are also contemplated. At block 1816, the liner isolation layer is etched to create a recessed portion. For example, as shown in FIGS. 5, 11 and 15, etching of the liner isolation layer leaves a liner isolation recess 542/1172/1582 on a sidewall of the TSV 450/950/1450.

Figure 19:
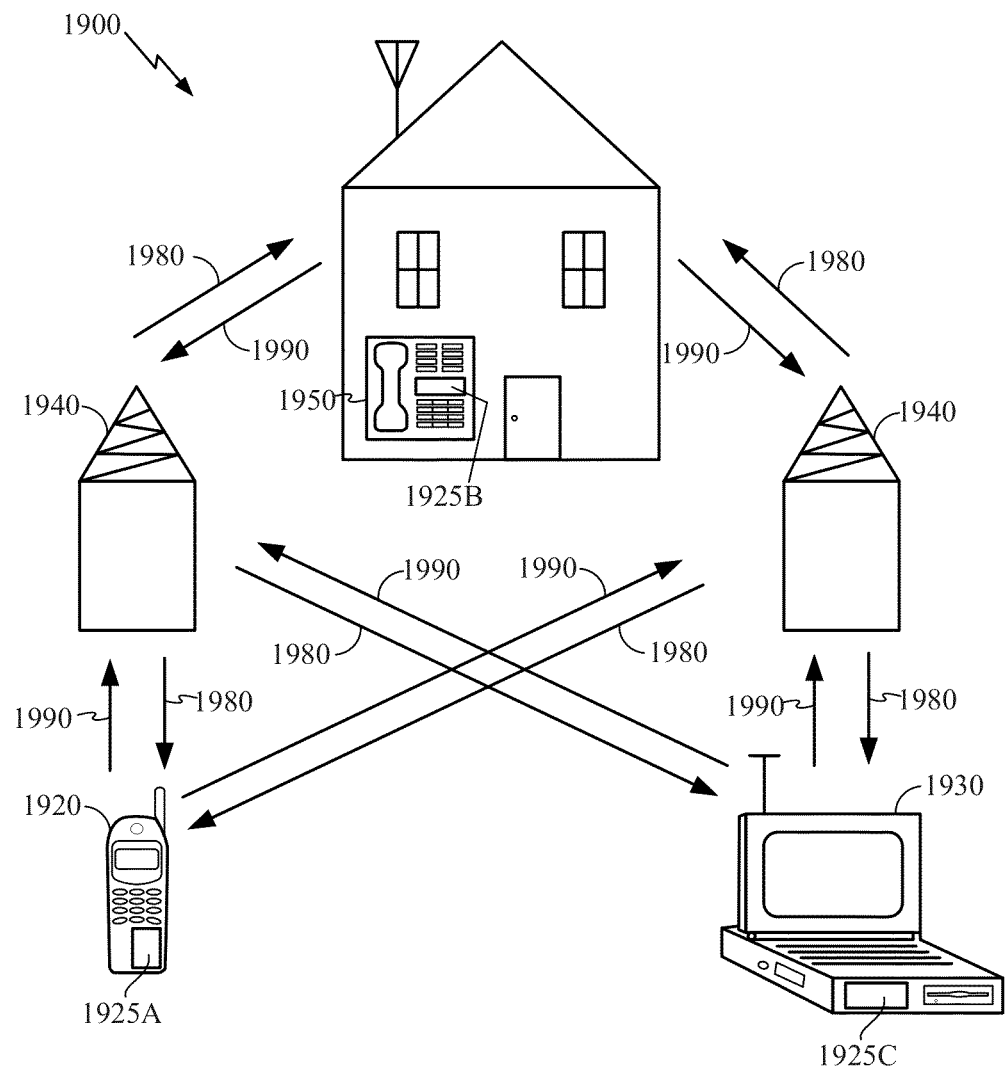
FIG. 19 is a block diagram showing a wireless communication system in which a configuration of the disclosure may be advantageously employed.

FIG. 19 is a block diagram showing an exemplary wireless communication system 1900 in which a configuration of the disclosure may be advantageously employed. For purposes of illustration, FIG. 19 shows three remote units 1920, 1930, and 1950 and two base stations 1940. It will be recognized that wireless communication systems may have many more remote units and base stations. Remote units 1920, 1930, and 1950 include IC devices 1925A, 1925C and 1925B, that include the disclosed through substrate via (TSV) surrounded by a liner isolation layer, It will be recognized that any device containing an IC may also include a TSV surrounded by the liner isolation layer disclosed here, including the base stations, switching devices, and network equipment. FIG. 19 shows forward link signals 1980 from the base station 1940 to the remote units 1920, 1930, and 1950 and reverse link signals 1990 from the remote units 1920, 1930, and 1950 to base stations 1940.

In FIG. 19, remote unit 1920 is shown as a mobile telephone, remote unit 1930 is shown as a portable computer, and remote unit 1950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 19 illustrates remote units according to the teachings of the disclosure, the disclosure is not limited to these exemplary illustrated units. Aspects of the present disclosure may be suitably employed in any device which includes a TSV surrounded by a isolation layer.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit, As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device, Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor die comprising:
a substrate having an active face;
conductive layers coupled to the active face;
a through substrate via extending only through the substrate and having a substantially constant diameter through a length of the through substrate via, the through substrate via comprising a conductive filler material;
a first isolation layer extending through the substrate, the first isolation layer having a first surface, on a surface of the substrate, and a second surface; and
a second isolation layer surrounding the through substrate via and comprising two portions, a recessed portion including an empty space near the active face of the substrate capable of relieving stress from the conductive filler material, and a dielectric portion, a composition of the recessed portion differing from the dielectric portion, the second surface of the first isolation layer being on the second isolation layer, the recessed portion defined between the first isolation layer and the conductive filler material.

2. The semiconductor die of claim 1, in which the recessed portion comprises a compliant back-fill material.

3. The semiconductor die of claim 1, in which the second isolation layer is comprised of a material selected from a group consisting of unfluorinated silica glass (USG), tetraethyl orthosilicate (TEOS), silicon oxide, silicon nitride, and an organic insulator.

4. The semiconductor die of claim 1, further comprising:
a shallow trench isolation (STI) region formed within the semiconductor substrate; and
an inter-layer dielectric (ILD) layer formed on the surface of the semiconductor substrate and the (STI) region.

5. The semiconductor die of claim 1, incorporated into at least one of a music player, a video player, an entertainment unit, a navigation device, a communications device, a personal digital assistant (PDA), a fixed location data unit, and a computer.

6. A semiconductor die, comprising:
a semiconductor substrate;
a through substrate via extending only through the substrate and having a substantially constant diameter through a length of the through substrate via, the through substrate via comprising a conductive filler material; and
first means for isolating the conductive filler material from the substrate, the first isolating means extending through the substrate, the first isolating means having a first surface, on a surface of the substrate, and a second surface; and second means for isolating the conductive filler material from the substrate, the second isolating means surrounding the through substrate via and comprising means for relieving stress from the conductive filler material, the stress relieving means including an empty space near an active face of the semiconductor substrate, the stress relieving means defined between the first isolating means and the conductive filler material.

7. The semiconductor die of claim 6, in which the second isolating means is comprised of a material selected from a group consisting of unfluorinated silica glass (USG), tetraethyl orthosilicate (TEOS), silicon oxide, silicon nitride, and an organic insulator.

8. The semiconductor die of claim 6, further comprising:
a shallow trench isolation (STI) region formed within the semiconductor substrate; and
an inter-layer dielectric (ILD) layer formed on the surface of the semiconductor substrate and the (STI) region.

9. The semiconductor die of claim 6, incorporated into at least one of a music player, a video player, an entertainment unit, a navigation device, a communications device, a personal digital assistant (PDA), a fixed location data unit, and a computer.

\* \* \* \* \*